(12) United States Patent
Rachmady et al.

(10) Patent No.: US 11,081,483 B2
(45) Date of Patent: Aug. 3, 2021

(54) CMOS CIRCUIT WITH A GROUP III-NITRIDE TRANSISTOR AND METHOD OF PROVIDING SAME

(71) Applicant: INTEL CORPORATION, Santa Clara, CA (US)

(72) Inventors: Willy Rachmady, Beaverton, OR (US); Ravi Pillarisetty, Portland, OR (US); Han Wui Then, Portland, OR (US); Marko Radosavljevic, Portland, OR (US); Sansaptak Dasgupta, Hillsboro, OR (US); Van H. Le, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 16/637,592

(22) PCT Filed: Sep. 29, 2017

(86) PCT No.: PCT/US2017/054601
§ 371 (c)(1),
(2) Date: Feb. 7, 2020

(87) PCT Pub. No.: WO2019/066966
PCT Pub. Date: Apr. 4, 2019

(65) Prior Publication Data
US 2020/0258884 A1    Aug. 13, 2020

(51) Int. Cl.
*H01L 27/092* (2006.01)
*H01L 29/06* (2006.01)
(Continued)

(52) U.S. Cl.
CPC ...... *H01L 27/0922* (2013.01); *H01L 21/8252* (2013.01); *H01L 29/0676* (2013.01);
(Continued)

(58) Field of Classification Search
CPC ............. H01L 27/0922; H01L 21/8252; H01L 29/0676; H01L 29/2003; H01L 29/205;
(Continued)

(56) References Cited

U.S. PATENT DOCUMENTS

| | | | | |
|---|---|---|---|---|
| 2013/0299789 A1* | 11/2013 | Yamazaki | ............. | H01L 27/322 257/40 |
| 2015/0303270 A1* | 10/2015 | Liaw | ..................... | H01L 23/528 257/9 |

(Continued)

FOREIGN PATENT DOCUMENTS

| | | |
|---|---|---|
| JP | 2016178186 | 10/2016 |
| WO | 2017099797 | 6/2017 |

OTHER PUBLICATIONS

International Search Report and Written Opinion for International Patent Application No. PCT/US17/54601, dated Jun. 29, 2018.
(Continued)

*Primary Examiner* — Tong-Ho Kim
(74) *Attorney, Agent, or Firm* — Green, Howard & Mughal LLP

(57) ABSTRACT

Techniques and mechanisms for providing a complementary metal-oxide-semiconductor (CMOS) circuit which includes a group III-nitride (III-N) material. In an embodiment, an n-type transistor of the CMOS circuit comprises structures which are variously disposed on a group III-N semiconductor material. The n-type transistor is coupled to a p-type transistor of the CMOS circuit, wherein a channel region of the p-type transistor comprises a group III-V semiconductor material. The channel region is configured to conduct current along a first direction, where a surface portion of the group III-N semiconductor material extends along a second direction perpendicular to the second direction. In another embodiment, the group III-N semiconductor material includes a gallium-nitride (GaN) compound, and the group
(Continued)

III-V semiconductor material includes a nanopillar of an indium antimonide (InSb) compound.

20 Claims, 8 Drawing Sheets

(51) Int. Cl.
    *H01L 29/20*     (2006.01)
    *H01L 29/205*     (2006.01)
    *H01L 29/778*     (2006.01)
    *H01L 29/786*     (2006.01)
    *H01L 21/8252*     (2006.01)
    *H01L 29/66*     (2006.01)

(52) U.S. Cl.
    CPC ........ *H01L 29/2003* (2013.01); *H01L 29/205* (2013.01); *H01L 29/66462* (2013.01); *H01L 29/66522* (2013.01); *H01L 29/66742* (2013.01); *H01L 29/7786* (2013.01); *H01L 29/78642* (2013.01); *H01L 29/78681* (2013.01); *H01L 29/78696* (2013.01)

(58) Field of Classification Search
    CPC ......... H01L 29/66462; H01L 29/66522; H01L 29/66742; H01L 29/7786; H01L 29/78642; H01L 29/78681; H01L 29/78696
    USPC .......................................................... 257/76
    See application file for complete search history.

(56) References Cited

U.S. PATENT DOCUMENTS

| | | |
|---|---|---|
| 2016/0078922 A1 | 3/2016 | Liaw |
| 2016/0276351 A1 | 9/2016 | Tanaka et al. |
| 2017/0012126 A1 | 1/2017 | Chu-Kung et al. |
| 2017/0263781 A1 | 9/2017 | Anderson et al. |
| 2018/0323106 A1* | 11/2018 | Dasgupta .......... H01L 21/02458 |

OTHER PUBLICATIONS

International Preliminary Report on Patentability from PCT/US2017/054601 notified Apr. 9, 2020, 7 pgs.

* cited by examiner

CMOS CIRCUIT WITH A GROUP III-NITRIDE TRANSISTOR AND METHOD OF PROVIDING SAME

CLAIM OF PRIORITY

This Application is a National Stage Entry of, and claims priority to, PCT Application No. PCT/US17/54601, filed on 29 Sep. 2017 and titled "CMOS CIRCUIT WITH A GROUP III-NITRIDE TRANSISTOR AND METHOD OF PROVIDING SAME", which is incorporated by reference in its entirety for all purposes.

BACKGROUND

1. Technical Field

Embodiments of the present invention generally relate to microelectronic devices and their methods of fabrication, and more particularly, but not exclusively, to CMOS circuit structures including a group III-nitride material.

2. Background Art

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers flow from the source to the drain. Complementary metal-oxide-semiconductor (CMOS) circuitry typically use a combination of a p-type metal-oxide-semiconductor (pMOS) FET and a n-type metal-oxide-semiconductor (nMOS) FET to implement logic gates and other digital circuits.

Gallium nitride materials and their group III-nitride (III-N) analogues show promise as integrated circuits materials. Due to their large bandgap and high mobility, these materials show particular promise for power management integrated circuits (PMIC), as well as various other high-frequency and/or high-power applications.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously include techniques and mechanisms for providing a high performance CMOS circuit with any of various group III-N materials. Gallium-nitride (GaN) transistors, for example, are expected to be increasingly important for enabling next-generation wireless modem standards and other such technologies. By their nature, GaN and other group III-N compounds cannot be used as a channel material of a p-type transistor. Some embodiments are based on a realization by the inventors that—e.g., due to efficient current, frequency response and other performance characteristics of group III-N n-type transistors—only a somewhat weak (e.g., low drive current) p-type transistor might be sufficient for implementing CMOS circuitry with a group III-N n-type transistor. Some embodiments provide for such a p-type transistor using any of various group III-V materials.

As used herein, "source or drain region" (or alternatively, "source/drain region") refers to a structure which is configured to function as one of a source of a transistor or a drain of a transistor. The phrase "group III-N n-type transistor" refers to any of various n-type transistors which include structures that extend over (e.g., are variously disposed directly or indirectly on) a group III-N semiconductor material, where a side portion of the group III-N semiconductor material is configured to provide at least part of a channel region of the n-type transistor. As used herein, "group III-V p-type transistor" refers herein to any of various p-type transistors, a channel region of which comprises a group III-V material.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including CMOS circuitry.

Figure 1:
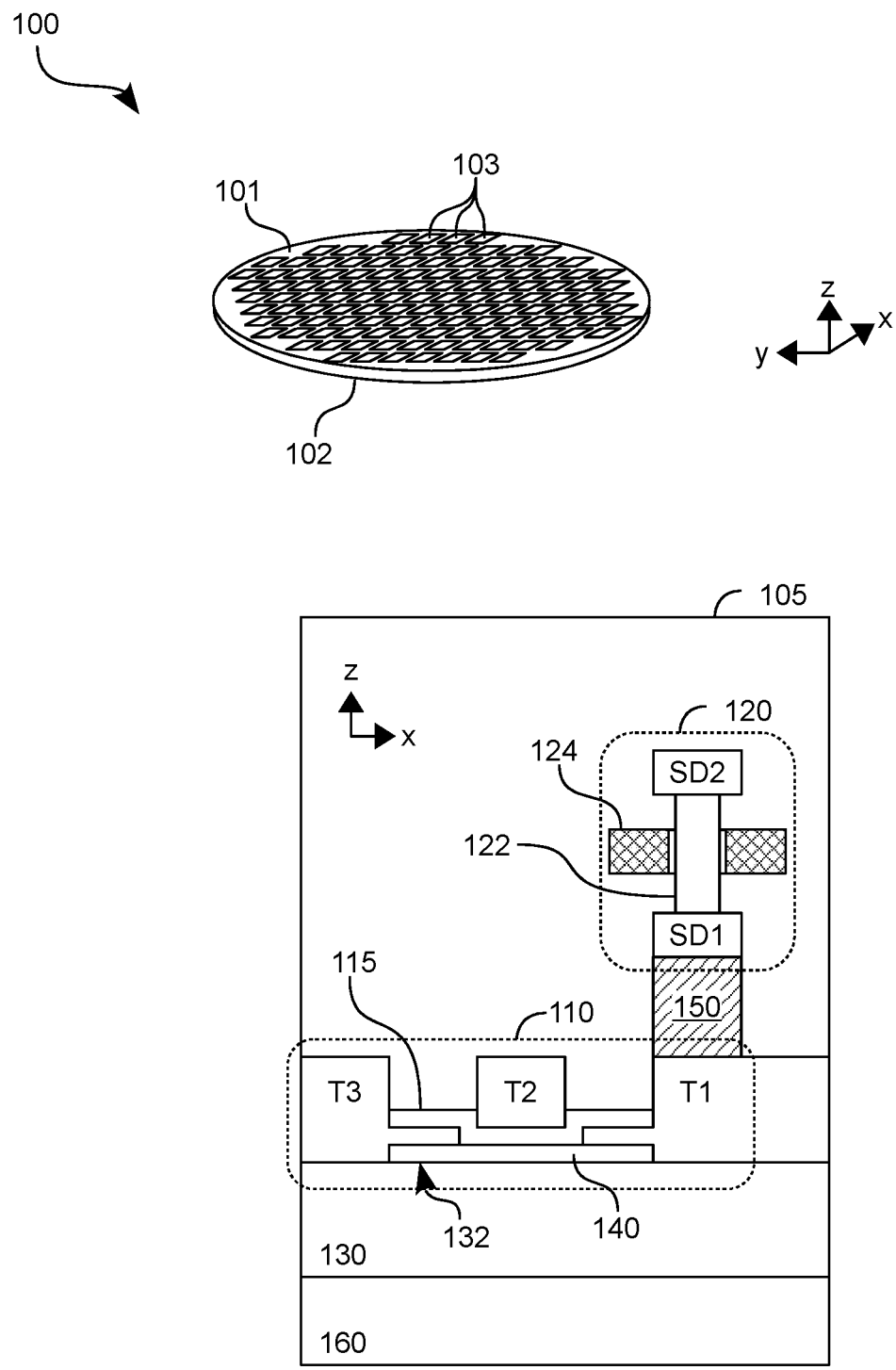
FIG. 1 shows a cross-sectional view of an integrated circuitry including a CMOS circuit according to an embodiment.

Referring to FIG. 1, a perspective view of a microelectronic wafer 100 according to an embodiment is shown. Wafer 100 may be made of a silicon wafer having a plurality of "streets" or severance lines formed in a lattice pattern on an active surface 101 thereof, and integrated circuit chips 103 formed as function elements in a plurality of areas sectioned by the plurality of severance lines. Wafer 100 may have a backside 102 opposite the active surface 101 as shown.

FIG. 1 also shows, in a cross-sectional side view, an example of integrated circuitry 105 of one of integrated circuit chips 103. Integrated circuitry 105 is one example of a CMOS circuit which includes a group III-N n-type transistor and a group III-V p-type transistor coupled thereto. Structures of the group III-N n-type transistor may be disposed on a side of group III-N semiconductor material, at least a portion of which extends in a plane. In such an embodiment, a channel region of the group III-V p-type transistor may be configured to conduct current in a direction which is orthogonal to said plane.

In the example embodiment shown, integrated circuitry 105 includes group III-N n-type transistor 110, at least some structures of which extend over a group III-N semiconductor material 130. In turn, group III-N semiconductor material 130 may be disposed directly or indirectly on a bulk semiconductor (e.g., silicon) substrate 160.

Terminal structures of the group III-N n-type transistor 110 (e.g., including two or more of the illustrative terminals T1, T2, T3 shown) may be directly or indirectly disposed on a side 132 of group III-N semiconductor material. Such terminal structures may, for example, include a gate terminal and at least one source or drain terminal.

In the example embodiment shown, terminal T2 is a gate terminal, and source or drain terminals are each provided by a respective one of terminals T1, T3. A mobility enhancement layer 140 may be disposed on the group III-N semiconductor material 130 in a region between terminals T2, T3. In such an embodiment, terminals T2 and T3 may include respective polarization charge inducing structures which variously extend each over an adjoining portion of mobility enhancement layer 140. The mobility enhancement layer may include, for example, at least one of aluminum (Al), gallium (Ga), or nitrogen (N)—e.g., wherein the mobility enhancement layer comprises a compound of aluminum nitride (AlN), a compound of gallium nitride (GaN), and/or any of various other compounds of nitrogen and one of gallium or aluminum. In combination with mobility enhancement layer 140, such polarization charge inducing structures may be configured to facilitate formation of a quantum well under an interface region of side 132. Current may be conducted in the quantum well based on a voltage at terminal T2—e.g., wherein a gate dielectric 115 provides some electrical insulation between terminal T2 and mobility enhancement layer 140.

Integrated circuitry may further comprise a group III-V p-type transistor 120 which is coupled to group III-N n-type transistor 110 via an electrode 150. In an embodiment, electrode 150 is coupled to (or is part of) terminal T3. Group III-V p-type transistor 120 is one example a p-type transistor, a channel region of which includes a group III-V material. The channel region may be configured to conduct current in a direction (e.g., parallel to the z-axis shown) that is orthogonal to another direction (along the x-axis, for example) in which part of side 316 extends. For example, group III-V p-type transistor 120 may include source or drain regions SD1, SD2 and a channel region 122 disposed therebetween. A gate electrode 124 may extend around or otherwise be proximate to channel region 122 to facilitate control of current in channel region 122. Channel region 122—e.g., comprising an indium antimonide (InSb) compound—may conduct current between source or drain regions SD1, SD2 based on a current provided to gate electrode 124.

Figure 2:
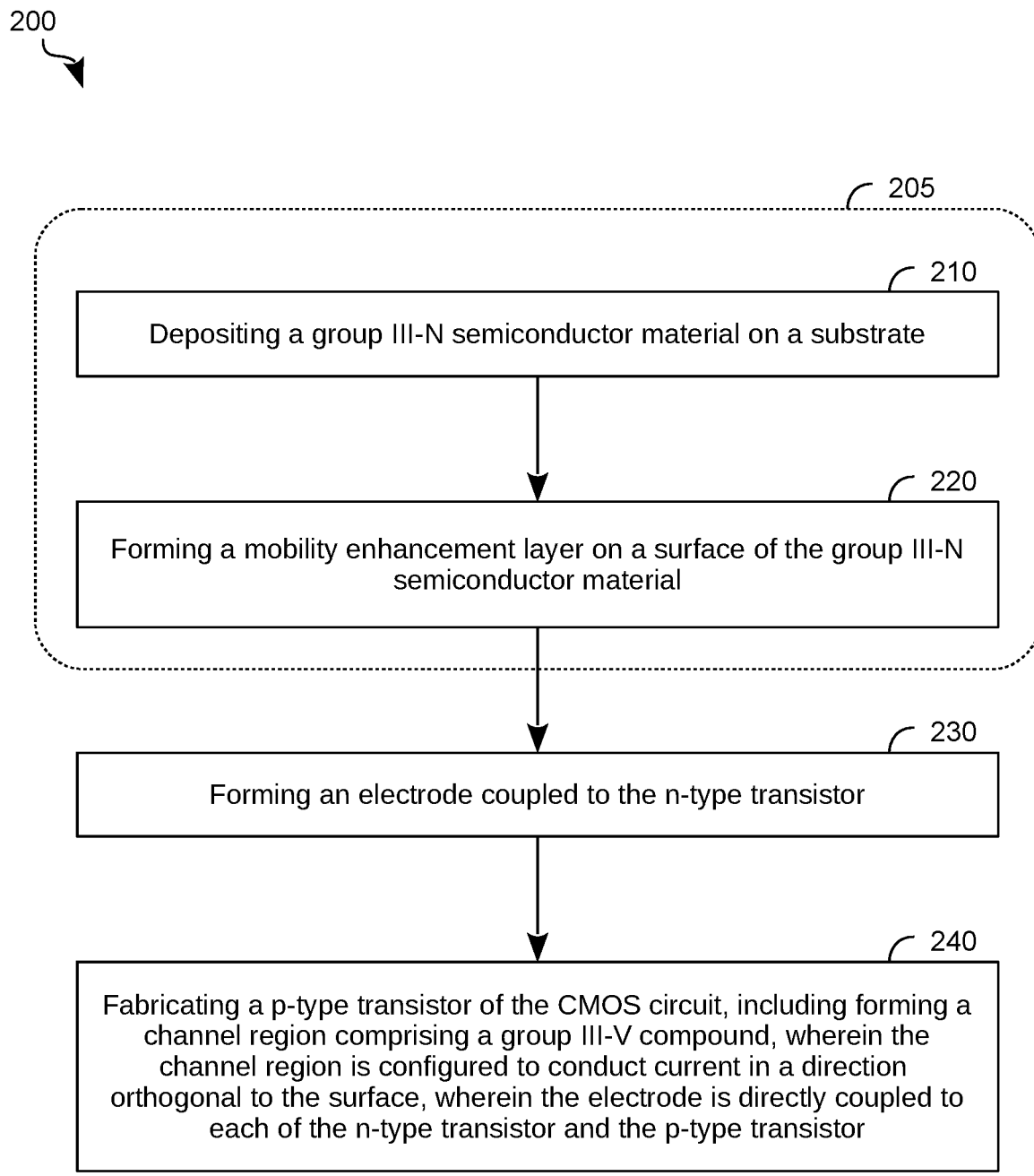
FIG. 2 is a flow diagram illustrating elements of a method for providing integrated circuit structures according to an embodiment.

FIG. 2 shows features of a method 200 to provide CMOS circuitry according to an embodiment. Method 200 may include processes to fabricate some or all of the structure of integrated circuitry 105, for example. To illustrate certain features of various embodiments, method 200 is described herein with reference to structures shown in FIGS. 3A-3C.

However, any of a variety of additional or alternative structures may be fabricated according to method 200, in different embodiments.

As shown in FIG. 2, method 200 may include operations 205 to form an n-type transistor of a CMOS circuit, the n-type transistor including structures disposed on a group III-N semiconductor material. Such operations 205 may include, for example, depositing a group III-N semiconductor material on a substrate (at 210) and forming a mobility enhancement layer on a surface of the group III-N semiconductor material (at 220).

Figure 3A:
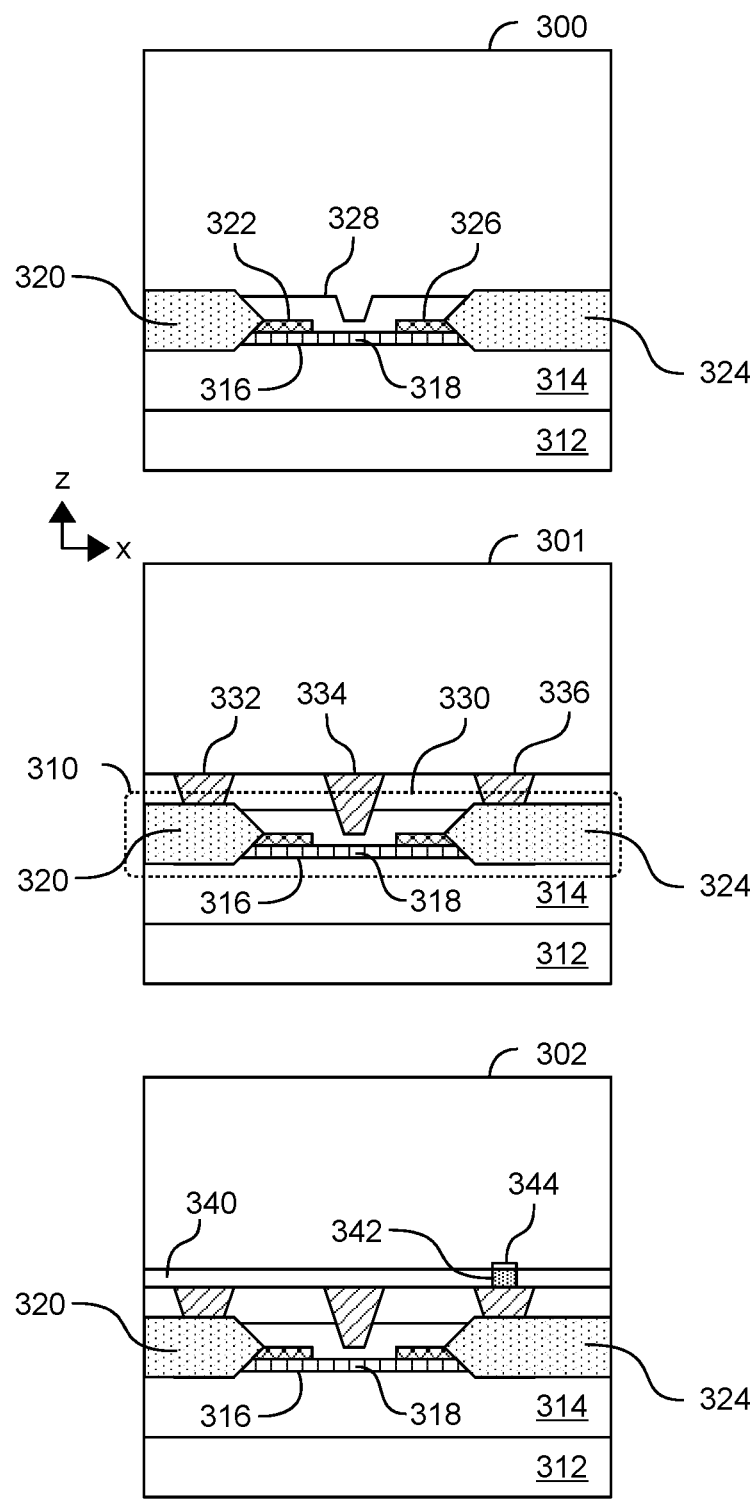
FIGS. 3A-3C show cross-sectional diagrams each illustrating structures at a respective stage of semiconductor fabrication processing according to an embodiment.
Figure 3B:
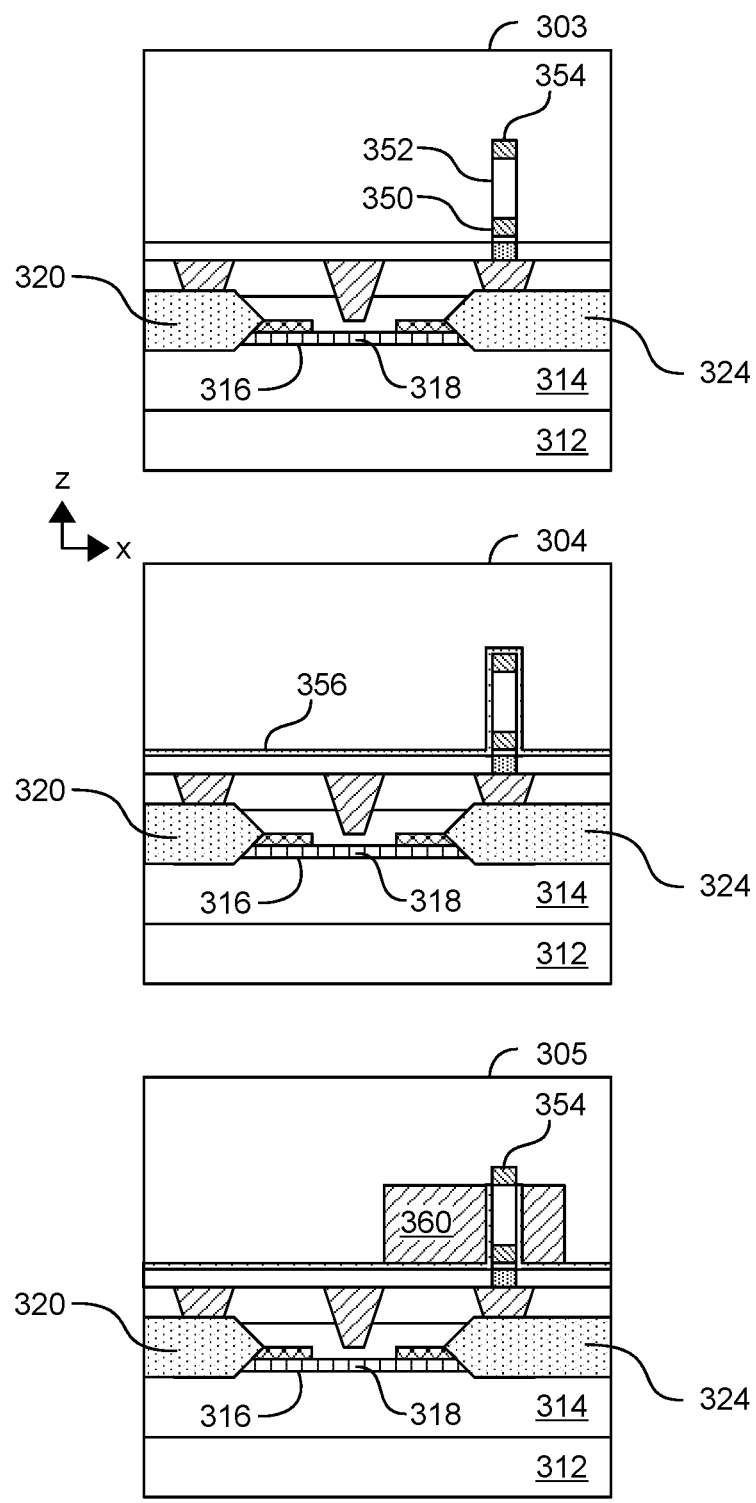
Figure 3C:
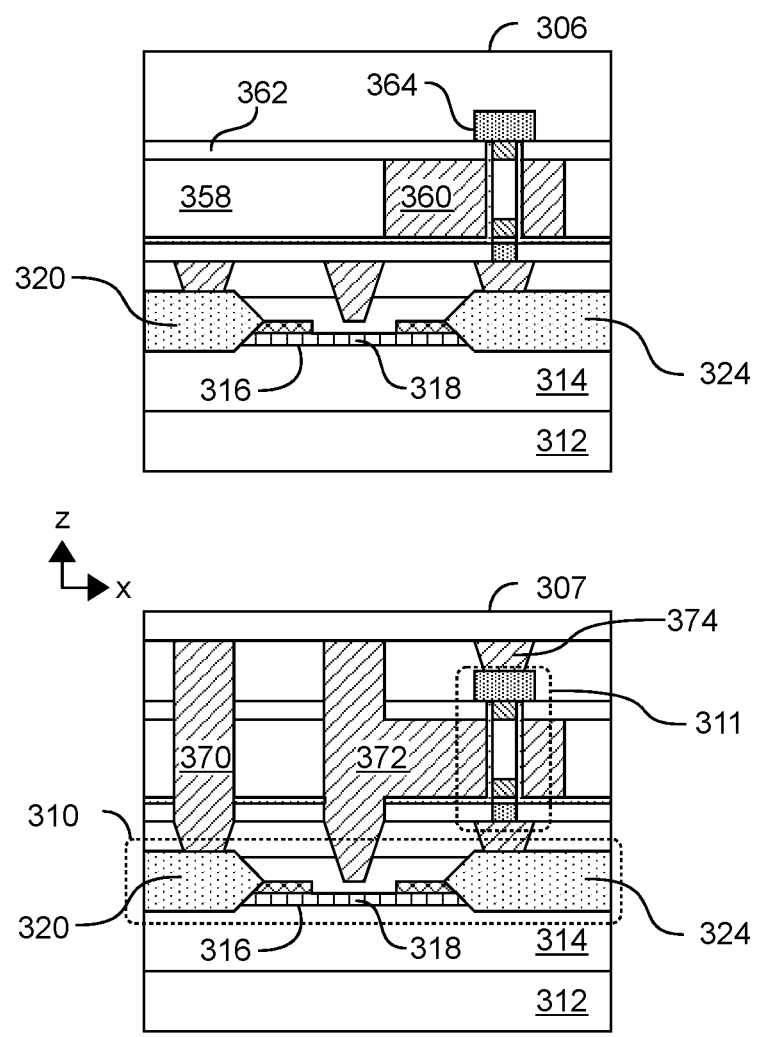

For example, referring now to FIGS. 3A-3C, cross-sectional side views are shown for respective stages 300-307 of processing to fabricate transistor structures according to an embodiment. As shown at stage 300, at least part of a group III-N semiconductor material 314 may be disposed between a substrate 312 and a mobility enhancement layer 318—e.g., where group III-N semiconductor material 314, substrate 312 and mobility enhancement layer 318 correspond functionally to layer 130, substrate 160 and mobility enhancement layer 140, respectively Structures of a group III-N n-type transistor may be variously formed directly or indirectly on a side 316 of group III-N semiconductor material 314. Such structures may include mobility enhancement layer 318, polarization charge inducing structures 322, 326 which extend over mobility enhancement layer 318, and raised source/drain structures 320, 324 which adjoin polarization charge inducing structures 322, 326, respectively. Substrate 312 may include a semiconductor material such as but not limited to silicon, silicon germanium (SiGe) or silicon carbide (SiC). In an embodiment, the group III-N semiconductor material 314 is grown on substrate 312 by a chemical vapor deposition (CVD) process.

In an embodiment, the group III-N semiconductor material 314 is a layer of a GaN compound. In one such embodiment, the group III-N semiconductor material 314 may have a relatively high carrier mobility (e.g., greater than 500 cm$^2$ V$^{-1}$). In one such embodiment, the group III-N semiconductor material 314 is a substantially undoped group III-nitride material (i.e., O$_2$ impurity concentration minimized) for minimal impurity scattering. In other embodiments, group III-N semiconductor material 314 includes one or more ternary alloys of GaN, such as AlGaN, InGaN, AlInN, or a quaternary alloy of GaN including at least one group III element and nitrogen, such as In$_x$Al$_y$Ga$_{1-x-y}$N. where x ranges from 0.01-0.1 and y ranges from 0.01-0.1. In an embodiment, the group III-N semiconductor material 314 has a material thickness in the range of 100 nm-5 um.

The mobility enhancement layer 318 may include a group III-N semiconductor material such as but not limited to AlN, InAlN or AlGaN. In an embodiment, the mobility enhancement layer 318 has an insufficient thickness to introduce 2DEG in the group III-N semiconductor material 314. In an embodiment, the mobility enhancement layer 318 has a thickness that is less than 1 nm to prevent the introduction of polarization difference on the underlying group III-N semiconductor material 314. In an embodiment, the mobility enhancement layer 318 and the underlying group III-N semiconductor material 314 are chosen to be binary alloys in order to reduce alloy scattering in the uppermost portion of the group III-N semiconductor material 314.

In an embodiment, the mobility enhancement layer 318 has a bandgap that is greater than the bandgap of the group III-N semiconductor material 314. In one such embodiment, a quantum well is formed below the interface between the mobility enhancement layer 318 and the group III-N semiconductor material 314. In an embodiment, the mobility enhancement layer 318 is an AlN layer and the underlying group III-N semiconductor material 314 is GaN. In one such embodiment, the presence of the quantum well and reduced alloy scattering enhances electron mobility in the GaN group III-N semiconductor material 314.

The n-doped raised source or drain structures 320, 324 may have respective uppermost surfaces that are above the level of the polarization charge inducing layer 122 and an isolation region 142 as illustrated in FIG. 1. In an embodiment, n-doped raised source or drain structures 320, 324 include an n-doped group III-N semiconductor material such as but not limited to an n-doped GaN or n-doped InxGa1-xN, where x is between 0.01 and 0.1. In one such embodiment, the n-doped InxGa1-xN is n-doped $In_{0.1}Ga_{0.9}N$. In an embodiment, the n-doped InxGa1-xN is doped with an n-type dopant such as Si or Ge having a dopant density that is at least $1e^{19}/cm^3$.

Polarization charge inducing structures 322, 326 may include a material capable of inducing a polarization difference in the uppermost portion of the group III-N semiconductor material 314, such as but not limited to $Al_zGa_{1-z}N$, $Al_wIn_{1-w}N$, or AlN, where Z ranges from 0.2-0.3 and W ranges from 0.7-0.85. In an embodiment, the polarization charge inducing structures 322, 326 each has a respective thickness greater than a minimum thickness needed to induce a sufficient polarization difference to create 2DEG effect in the uppermost portion of the group III-N semiconductor material 314. In one such embodiment, the polarization charge inducing structures 322, 326 each has a thickness that is approximately in the range of 3-20 nm. In an embodiment, the polarization charge inducing structures 322, 326 include AlGaN and the group III-N semiconductor material 314 is GaN. In one such embodiment, the AlGaN polarization charge inducing structures 322, 326 each has a respective thickness that is approximately in the range of 3 nm-5 nm. In an embodiment, the mobility enhancement layer 318 is AlN, the polarization charge inducing structures 322, 326 are AlGaN and the group III-N semiconductor material 314 is GaN. In one such embodiment, the AlN mobility enhancement layer 318 has a thickness that is in the range of 0.8 nm-1.2 nm and the AlGaN polarization charge inducing structures 322, 326 each has a thickness that is in the range of 3 nm-5 nm.

Gate dielectric 328 may include a gate dielectric material such as but not limited to $Al_2O_3$, $HfO_2$, $ZrO_2$, TiSiO, HfSiO or $Si_3N_4$. In an embodiment, the gate dielectric 328 has a thickness that is approximately in the range of 2 nm-10 nm. Gate dielectric 328 may include a composite stack including two separate and distinct layers of gate dielectric materials chosen from the above group of gate dielectric materials. In one such embodiment, a layer of gate dielectric material of one type is disposed on a layer of gate dielectric material of a different type to form the composite stack.

Referring again to FIG. 2, method 200 may further comprise, at 230, forming a first contact metal coupled to the n-type transistor. For example, as shown at stage 301, connectivity with a group III-N n-type transistor 310—including mobility enhancement layer 318, polarization charge inducing structures 322, 326, and raised source/drain structures 320, 324—may be facilitated at least in part by a dielectric 330 being formed on gate dielectric layer 328 and raised source/drain structures 320, 324. Such formation may include blanket deposition of an insulator material using a process such as but limited to a plasma-enhanced chemical vapor deposition (PECVD), chemical vapor deposition (CVD) or physical vapor deposition (PVD). The insulator material may include any of various compounds such as but not limited to silicon oxide, silicon oxynitride or silicon carbide.

Subsequent mask and etch processing may form in dielectric 330 recesses to accommodate the deposition therein of various metallization structures (such as the illustrative electrodes 332, 334, 336 shown). For example, the insulator material may be plasma etched—or alternatively, reactive-ion etched utilizing a chemistry including Ar, $O_2$, CO and a fluorocarbon such as but not limited to $CHF_3$, $CH_2F_2$, or $C_4F_8$—through a mask to expose respective portions of gate dielectric layer 328 and raised source/drain structures 320, 324. Some or all of electrodes 332, 334, 336 may each include any of a variety of conductors including, but not limited to, Ni, Ti, Pt or W. In one embodiment, electrode 334 (for example) includes a work function layer such as but not limited to Pt, Ni, TiN or TaN. In such an embodiment, the gate electrode 334 may include a gate cap metal (not shown) on the work function layer—e.g., wherein the gate cap metal is tungsten. The forming at 230 of method 200 may, for example, include forming some or all of electrodes 332, 334, 336.

Method 200 may further comprise, at 240, fabricating a p-type transistor of the CMOS circuit, including forming a channel region comprising a group III-V compound. In such an embodiment, the channel region is configured to conduct current in a direction which is orthogonal to the surface of the group III-N semiconductor material. The first contact metal may be directly coupled to each of the n-type transistor and the p-type transistor. For example, at stage 302, a patterned metallization layer 340, including a via 342 formed therein, may be formed on dielectric 330. Fabrication of patterned metallization layer 340 may include operations similar to those described herein for fabrication of dielectric layer 330 and electrodes 332, 334, 336. A seed layer 344 (e.g., comprising gold) may be selectively deposited on a top surface of via 342.

As shown at stage 303, deposition processing may successively from on seed layer 344 a p-type doped source or drain structure 350, channel structure 352, and p-type doped source or drain structure 354. In one embodiment, respective materials of channel structure 352 and p-type doped source or drain structures 350, 354 may be variously deposited to form nanopillar structure—e.g., using a process called Vapor-Liquid-Solid (VLS) epitaxial growth process. VLS may facilitate small area one-dimensional crystal growth on seed layer 344—e.g., wherein said growth is assisted by a metal catalyst. The metal catalyst may form liquid alloy droplets at a high temperature by adsorbing vapor components. For example, metal colloids (e.g., gold or nickel) may be exposed to a silicon source gas (e.g., $SiH_4$) and high temperature. The silicon source gas may be dissolved into the colloidal particles and silicon sections grown on the colloids. Supersaturation drives precipitation of alloy component at a liquid-solid interface, resulting in crystal growth which is primarily one-dimensional (e.g., along the z-axis shown). Vapor components may be varied during VLS processes—e.g., including the selective inclusion or exclusion of p-type dopant—for boron (for example) to be included in p-type doped source or drain structures 350, 354, and for channel structure 352 to include an intrinsic semiconductor material.

In another embodiment, the channel structure 352 and p-type doped source or drain structures 350, 354 may be deposited using conventional lithography and etching processes in which a thin silicon film is deposited on the dielectric layer 104, using method such as CVD or plasma enhanced CVD, and patterned (e.g., etching) to form the individual nanowire 106. It is to be noted that other methods can be used to form the nanowire 106 on the dielectric layer 104 as is known in the art.

As stage 304, a high-K dielectric 356 may be deposited on respective sidewall structures of channel structure 352, and p-type doped source or drain structures 350, 354. Dielectric 356 may further extend, for example, on a top side of patterned metallization layer 340. Formation of dielectric 356 may include features of processing such as that to form gate dielectric 328, for example.

At stage 305, an electrode portion 360 may be deposited to variously extend around channel structure 352 and p-type doped source or drain structures 350, 354. In such an embodiment, dielectric 356 provides partial electrical insulation between electrode portion 360 and each one of channel structure 352 and p-type doped source or drain structure 350, 354. Polishing may subsequently be performed to remove a top portion of dielectric 356, thereby exposing a surface of p-type doped source or drain structure 354.

As shown at stage 306, subsequent dielectric structures (such as the illustrative dielectric films 358, 362 shown) may be deposited—e.g., in preparation for metallization processes. Formation of dielectric films 358, 362 may include features of processing such as that to form dielectric 330, for example. In an embodiment, a p-type doped epitaxial structure 364 may be grown on p-type doped source or drain structure 354. In one example embodiment, p-type doped epitaxial structure 364 includes one or more layers each including, for example, a respective an indium antimonide (InSb) compound, indium arsenide (IsAs) compound or any of various other suitable materials.

As variously shown at stage 307, a resulting group III-V p-type transistor 311 may include channel structure 352, p-type doped source or drain structures 350, 354, and p-type doped epitaxial structure 364. Subsequent metallization structures may be deposited to facilitate further coupling of group III-N n-type transistor 310 and group III-V p-type transistor 311 with each other and/or with other circuitry. By way of illustration and not limitation, additional masking, etch and metal deposition processes may be performed—e.g., thereby extending connectivity with electrode 332 to form an electrode 370 through some or all of layers 340, 358, 362. Alternatively or in addition, electrode 334 may be coupled with electrode portion 360 to form an electrode 372. In some embodiments, an electrode 374 is formed on p-type doped epitaxial structure 364. However, any of a variety of additional or alternative metallization structures may be formed at stage 307, in other embodiments.

As shown in the configuration at stage 307, channel structure 352 of group III-V p-type transistor 311 is configured to conduct current in a first direction (e.g., parallel to the z-axis shown) between p-type doped source or drain structures 350, 354. In such an embodiment, the side 316 of group III-N semiconductor material 314 may extend—e.g., at least in a region under mobility enhancement layer 318 and polarization charge inducing structures 322, 326—in a second direction (e.g., in an x-y plane) which is orthogonal to the first direction. The channel region of group III-N n-type transistor 310 may conduct current along such a second direction—e.g., at side 316 in a region under mobility enhancement layer 318 and polarization charge inducing structures 322, 326. In an alternative embodiment, group III-N n-type transistor 310 may be configured to conduct current in a direction which is also in parallel with the z-axis—e.g., wherein one source or drain terminal of group III-N n-type transistor 310 is instead disposed under group III-N semiconductor material 314.

Figure 4:
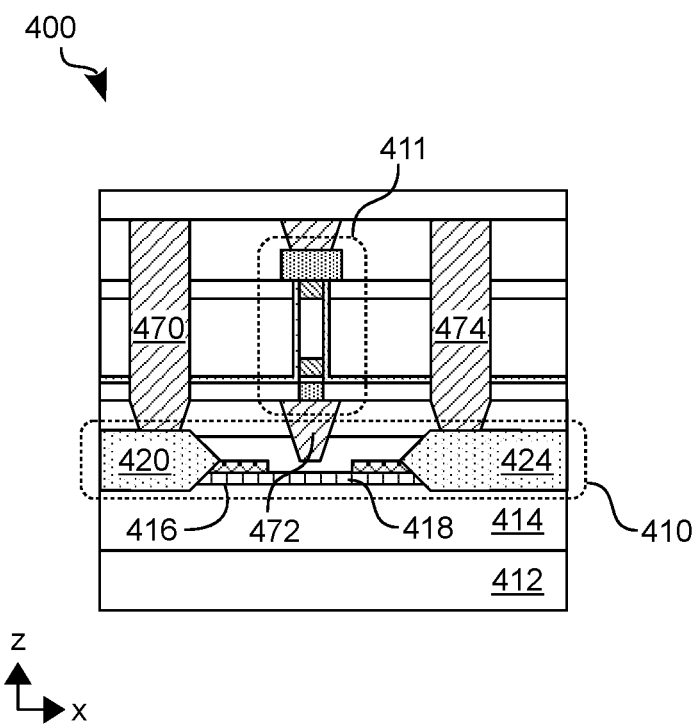
FIG. 4 shows a cross-sectional view of a CMOS circuit according to an embodiment.

As illustrated by the configuration at stage 307, for example, a group III-V p-type transistor may be coupled to a group III-N n-type transistor via a source or drain terminal of that group III-N n-type transistor. In other embodiments, a group III-V p-type transistor may instead be coupled to a group III-N n-type transistor via a gate terminal of the group III-N n-type transistor. For example, FIG. 4 shows features of a CMOS circuit structures 400 according to an embodiment. CMOS circuit structures 400 may include features of integrated circuitry 105. Alternatively or in addition, some or all of CMOS circuit structures 400 may be fabricated according to method 200.

As shown in FIG. 4, CMOS circuit structures 400 may include a group III-N semiconductor material 414 disposed between a substrate 412 and a mobility enhancement layer 418—e.g., where group III-N semiconductor material 414, substrate 412 and mobility enhancement layer 418 correspond functionally to layer 130, substrate 160 and mobility enhancement layer 140, respectively. A group III-N n-type transistor 410 of CMOS circuit structures 400 may include mobility enhancement layer 418, polarization charge inducing structures 422, 426, and raised source/drain structures 420, 424 (e.g., corresponding to mobility enhancement layer 318, polarization charge inducing structures 322, 326, and raised source/drain structures 320, 324, respectively).

Raised source/drain structures 420, 424 may be coupled to respective electrodes 470, 474—e.g., where a gate electrode 472 is coupled to, or is to function as, a gate terminal of group III-N n-type transistor 410. In such an embodiment, a group III-V p-type transistor 411 may be coupled to group III-N n-type transistor 410 via gate electrode 472 (and/or any other gate terminal structure of group III-N n-type transistor 410). Group III-V p-type transistor 411 may have some or all of the features of group III-V p-type transistor 311. For example, a surface 416 of group III-N semiconductor material 414 may extend along a first direction (e.g., in parallel with the x-axis shown), at least in a region under mobility enhancement layer 418. A channel region of group III-V p-type transistor 411 may configured to conduct current in a second direction (e.g., parallel to the z-axis shown) which is orthogonal to the first direction.

Figure 5:
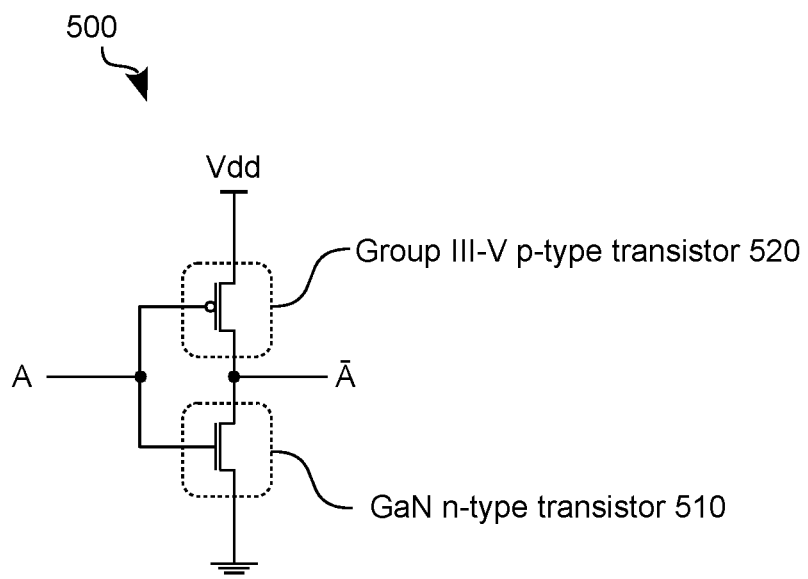
FIG. 5 is a circuit diagram illustrating elements of CMOS inverter including circuit structures according to an embodiment.

FIG. 5 shows one example of a circuit 500 that may be provided with semiconductor structures fabricated according to an embodiment. Such semiconductor structures may be fabricated with processing such as that of method 200 and/or that which is illustrated by stages 300-307. Alternatively or in addition, circuit 500 may be provided with IC device 100, for example.

In the example embodiment shown, circuit 500 includes a group III-V p-type transistor 520 and a GaN n-type transistor 510 coupled thereto. More particularly, source terminals of GaN n-type transistor 510 and group III-V p-type transistor 520 may be coupled, respectively, to a supply voltage Vdd and to a reference potential (e.g., ground). In such an embodiment, respective drain terminals of GaN n-type transistor 510 and group III-V p-type transistor 520 may be coupled to one another at an output node A—e.g., where respective gates terminals of GaN n-type transistor 510 and group III-V p-type transistor 520 are coupled to one another at an input node A. Circuit 500 may thus be configured to provide signal inverter functionality—e.g., wherein input node A is to receive a first signal representing a first logical state, and output node A is to provide a second signal, based on the first signal representing an opposite logical state.

Figure 6:
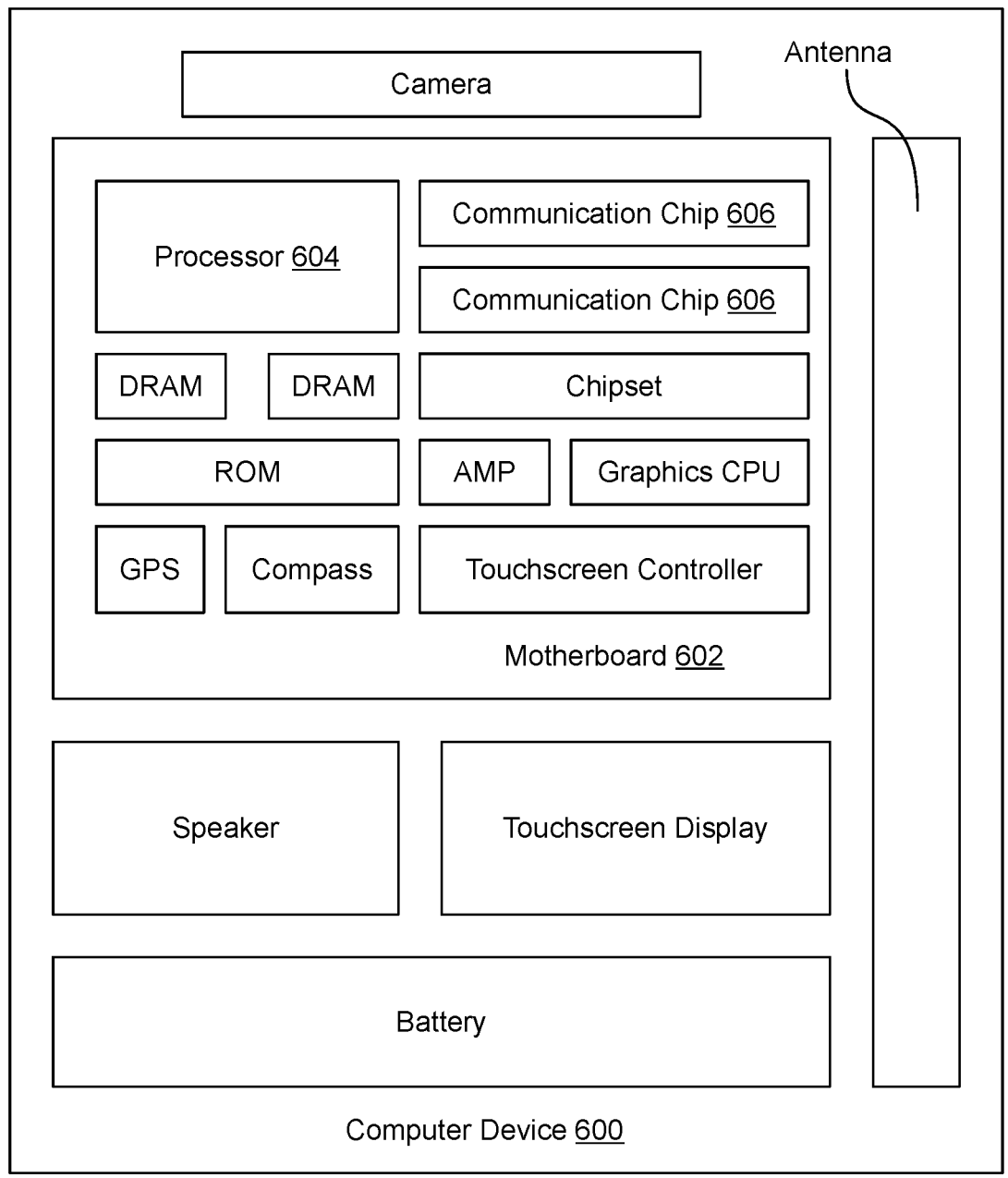
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
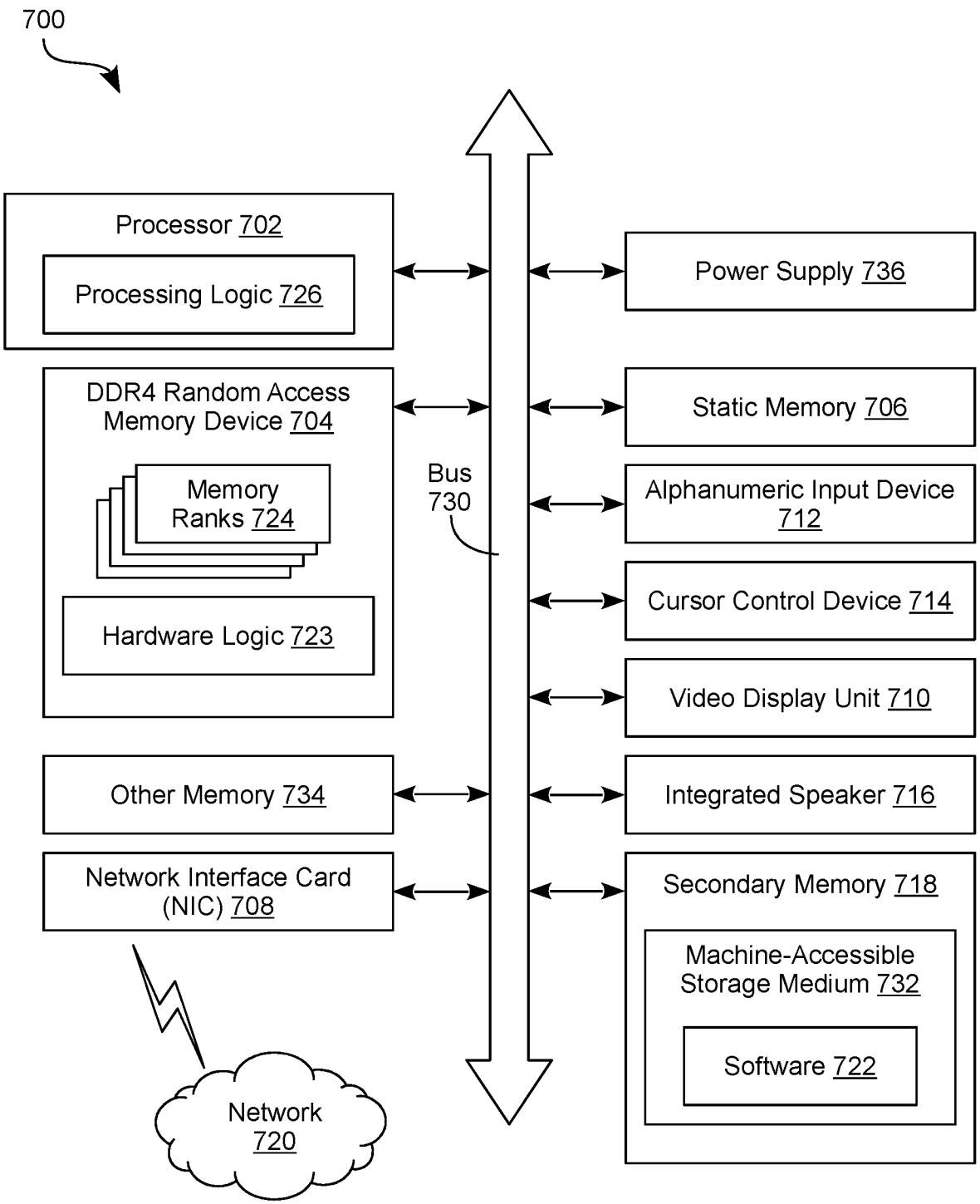
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, complementary metal-oxide-semiconductor (CMOS) circuit comprises an n-type transistor comprising a group III-nitride (III-N) semiconductor material disposed on a substrate, and a layer comprising at least one of aluminum (Al), gallium (Ga), or nitrogen (N), the layer disposed on a surface of the group III-N semiconductor material. The CMOS circuit further comprises a p-type transistor including a channel region comprising a group III-V compound, wherein the channel region is configured to conduct current in a direction which is orthogonal to the surface of the group III-N semiconductor material, and an electrode directly coupled to each of the n-type transistor and the p-type transistor.

In one embodiment, the group III-N semiconductor material includes a gallium nitride (GaN) compound. In another embodiment, the layer includes an aluminum gallium nitride (AlGaN) compound. In another embodiment, the p-type transistor is coupled to the n-type transistor via a drain terminal of the n-type transistor. In another embodiment, the p-type transistor is coupled to the n-type transistor via a gate terminal of the n-type transistor. In another embodiment, another channel region of the n-type transistor is configured to conduct current in a direction which is orthogonal to the surface of the group III-N semiconductor material. In another embodiment, the group III-V compound includes an indium antimonide (InSb) compound. In another embodiment, the p-type transistor includes a nanopillar structure comprising the channel region.

In another implementation, a method comprises fabricating an n-type transistor of a complementary metal-oxide-semiconductor (CMOS) circuit, including depositing a group III-nitride (III-N) semiconductor material on a substrate, and forming a layer comprising at least one of aluminum (Al), gallium (Ga), or nitrogen (N) on a surface of the group III-N semiconductor material. The method further comprises forming an electrode coupled to the n-type transistor, and fabricating a p-type transistor of the CMOS circuit, including forming a channel region comprising a group III-V compound, wherein the channel region is configured to conduct current in a direction which is orthogonal to the surface of the group III-N semiconductor material, wherein the electrode is directly coupled to each of the n-type transistor and the p-type transistor.

In one embodiment, the group III-N semiconductor material includes a gallium nitride (GaN) compound. In another embodiment, the layer includes an aluminum gallium nitride (AlGaN) compound. In another embodiment, the p-type transistor is coupled to the n-type transistor via a drain terminal of the n-type transistor. In another embodiment, the p-type transistor is coupled to the n-type transistor via a gate terminal of the n-type transistor. In another embodiment, another channel region of the n-type transistor is configured to conduct current in a direction which is orthogonal to the surface of the group III-N semiconductor material. In another embodiment, the group III-V compound includes an indium antimonide (InSb) compound. In another embodiment, the p-type transistor includes a nanopillar structure comprising the channel region.

In another implementation, a system comprises a complementary metal-oxide-semiconductor (CMOS) circuit comprising an n-type transistor comprising a group III-nitride (III-N) semiconductor material disposed on a substrate, and a layer comprising at least one of aluminum (Al), gallium (Ga), or nitrogen (N), the layer disposed on a surface of the group III-N semiconductor material. The CMOS circuit further comprises a p-type transistor including a channel region comprising a group III-V compound, wherein the channel region is configured to conduct current in a direction which is orthogonal to the surface of the group III-N semiconductor material, and an electrode directly coupled to each of the n-type transistor and the p-type transistor. The system further comprises a display device coupled to the CMOS circuit, the display device to display an image based on a signal communicated with the CMOS circuit.

In one embodiment, the group III-N semiconductor material includes a gallium nitride (GaN) compound. In another embodiment, the layer includes an aluminum gallium nitride (AlGaN) compound. In another embodiment, the p-type transistor is coupled to the n-type transistor via a drain terminal of the n-type transistor. In another embodiment, the p-type transistor is coupled to the n-type transistor via a gate terminal of the n-type transistor. In another embodiment, another channel region of the n-type transistor is configured to conduct current in a direction which is orthogonal to the surface of the group III-N semiconductor material. In another embodiment, the group III-V compound includes an indium antimonide (InSb) compound. In another embodiment, the p-type transistor includes a nanopillar structure comprising the channel region.

Techniques and architectures for providing CMOS circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A complementary metal-oxide-semiconductor (CMOS) circuit comprising:
   an n-type transistor comprising:
      a group III-nitride (III-N) semiconductor material disposed on a substrate; and
      a layer comprising at least one of aluminum (Al), gallium (Ga), or nitrogen (N), the layer disposed on a surface of the group III-N semiconductor material;
   a p-type transistor including a channel region comprising a group III-V compound, wherein the channel region is configured to conduct current in a direction which is orthogonal to the surface of the group III-N semiconductor material; and
      an electrode directly coupled to each of the n-type transistor and the p-type transistor.

2. The CMOS circuit of claim 1, wherein the group III-N semiconductor material includes a gallium nitride (GaN) compound.

3. The CMOS circuit of claim 1, wherein the layer includes an aluminum gallium nitride (AlGaN) compound.

4. The CMOS circuit of claim 1, wherein the p-type transistor is coupled to the n-type transistor via a drain terminal of the n-type transistor.

5. The CMOS circuit of claim 1, wherein the p-type transistor is coupled to the n-type transistor via a gate terminal of the n-type transistor.

6. The CMOS circuit of claim 1, wherein another channel region of the n-type transistor is configured to conduct current in a direction which is orthogonal to the surface of the group III-N semiconductor material.

7. The CMOS circuit of claim 1, wherein the group III-V compound includes an indium antimonide (InSb) compound.

8. The CMOS circuit of claim 1, wherein the p-type transistor includes a nanopillar structure comprising the channel region.

9. A method comprising:
   fabricating an n-type transistor of a complementary metal-oxide-semiconductor (CMOS) circuit, including:
      depositing a group III-nitride (III-N) semiconductor material on a substrate; and
      forming a layer comprising at least one of aluminum (Al), gallium (Ga), or nitrogen (N) on a surface of the group III-N semiconductor material;
   forming an electrode coupled to the n-type transistor; and
   fabricating a p-type transistor of the CMOS circuit, including forming a channel region comprising a group III-V compound, wherein the channel region is configured to conduct current in a direction which is orthogonal to the surface of the group III-N semiconductor material, wherein the electrode is directly coupled to each of the n-type transistor and the p-type transistor.

10. The method of claim 9, wherein the group III-N semiconductor material includes a gallium nitride (GaN) compound.

11. The method of claim 9, wherein the layer includes an aluminum gallium nitride (AlGaN) compound.

12. The method of claim 9, wherein the p-type transistor is coupled to the n-type transistor via a drain terminal of the n-type transistor.

13. The method of claim 9, wherein the p-type transistor is coupled to the n-type transistor via a gate terminal of the n-type transistor.

14. The method of claim 9, wherein another channel region of the n-type transistor is configured to conduct current in a direction which is orthogonal to the surface of the group III-N semiconductor material.

15. The method of claim 9, wherein the group III-V compound includes an indium antimonide (InSb) compound.

16. The method of claim 9, wherein the p-type transistor includes a nanopillar structure comprising the channel region.

17. A system comprising:
   a complementary metal-oxide-semiconductor (CMOS) circuit comprising:
      an n-type transistor comprising:

a group III-nitride (III-N) semiconductor material disposed on a substrate; and a layer comprising at least one of aluminum (Al), gallium (Ga), or nitrogen (N), the layer disposed on a surface of the group III-N semiconductor material;

a p-type transistor including a channel region comprising a group III-V compound, wherein the channel region is configured to conduct current in a direction which is orthogonal to the surface of the group III-N semiconductor material; and an electrode directly coupled to each of the n-type transistor and the p-type transistor; and a display device coupled to the CMOS circuit, the display device to display an image based on a signal communicated with the CMOS circuit.

18. The system of claim 17, wherein the group III-N semiconductor material includes a gallium nitride (GaN) compound.

19. The system of claim 17, wherein the layer includes an aluminum gallium nitride (AlGaN) compound.

20. The system of claim 17, wherein the p-type transistor is coupled to the n-type transistor via a drain terminal of the n-type transistor.

* * * * *